United States Patent
Kottapalli

(10) Patent No.: US 8,803,584 B1
(45) Date of Patent: Aug. 12, 2014

(54) LEVEL SHIFTER FOR NOISE AND LEAKAGE SUPPRESSION

(76) Inventor: Venkata Kottapalli, Sunnyvale, CA (US)

( * ) Notice: Subject to any disclaimer, the term of this patent is extended or adjusted under 35 U.S.C. 154(b) by 1043 days.

(21) Appl. No.: 11/132,052

(22) Filed: May 17, 2005

(51) Int. Cl.
*H03L 5/00* (2006.01)
(52) U.S. Cl.
USPC ........................................................ 327/333
(58) Field of Classification Search
None
See application file for complete search history.

(56) References Cited

U.S. PATENT DOCUMENTS

| | | | | |
|---|---|---|---|---|
| 5,734,914 A | * | 3/1998 | Nakamura et al. | 713/300 |
| 6,574,577 B2 | * | 6/2003 | Stapleton et al. | 702/117 |
| 6,600,338 B1 | * | 7/2003 | Nguyen et al. | 326/68 |
| 2002/0024374 A1 | * | 2/2002 | Ovens et al. | 327/333 |
| 2003/0229770 A1 | * | 12/2003 | Jeddeloh | 711/213 |
| 2005/0146355 A1 | * | 7/2005 | Kase et al. | 326/81 |

* cited by examiner

*Primary Examiner* — Lincoln Donovan
*Assistant Examiner* — Khareem E Almo

(57) ABSTRACT

A level shifter circuit is disclosed that gates at least one of a plurality of input terminals of a level shifter to at least one of a plurality of supply voltages that are associated with respective supply voltage domains when the at least one of the plurality of supply voltages is powered down. The level shifter is therefore insensitive to noise on the input terminals and also reduces leakage current associated with noise induced crowbar currents.

20 Claims, 5 Drawing Sheets

LEVEL SHIFTER FOR NOISE AND LEAKAGE SUPPRESSION

TECHNICAL FIELD

Embodiments of the present invention pertain to level shifters used for noise and leakage suppression.

BACKGROUND ART

Circuit miniaturization allows circuits of many different types to be contained on a single chip. The different circuits that are contained on a chip may have different power requirements. In order to make the most efficient use of available power, power can be managed so that appropriate voltages are allocated to the various circuits. By managing the power appropriately, power consumption of the chip can be reduced. A level shifter circuit can be used between circuit blocks that have different power domains, e.g., use different power sources.

FIG. 1 shows a conventional level shifter circuit 100. In FIG. 1, conventional level shifter 100 bridges respective power supply voltage domains that correspond to supply voltages Vdd1 117 and Vdd2 119. As is shown in FIG. 1, the power supply voltage domains share a common ground (gnd) 121. Complimentary, full-swing signals in the power supply voltage domain corresponding to supply voltage Vdd1 117 are converted into complimentary, full swing signals in the power supply voltage domain corresponding to supply voltage Vdd2 119.

In operation, referring to FIG. 1, when either the voltage at node in 101 or node inb 103 exceeds Vtn relative to gnd 121 an input NFET, either 105 or 107 respectively, turns "on". When node in 101 goes "high", node intb 123 falls and drives output terminal out 127 "high". When node intb 123 falls, cross coupled PFET 111 is turned "on" which drives node int 125 "high". When node int 125 rises, node outb 129 is driven "low".

However, level shifter 100 is susceptible to noise and leakage when the input power supply is powered down. When the input power supply Vdd1 117 is powered down (zero volts) circuit input drivers assume a high impedance condition. In conventional designs such as that shown in FIG. 1, both inputs are weakly driven to zero by leakage currents from the input power supply Vdd1 117 and gnd 121. Because the inputs 101 and 103 are weakly driven to zero, they are susceptible to coupled noise injection which they may be very slow to recover from.

Noise on the input terminals 101 and 103 can turn on the NFETs 105 and 107 respectively and can produce unwanted leakage currents from Vdd2 119 and gnd 121 due to crowbar current flowing through the FETs 109 and 105 or FETs 111 and 107. Leakage currents dissipate power. Also, noise on input terminals 101 and 103 can create erroneous outputs at the output terminals 127 and 129. Also shown in FIG. 1 is inverters 113 and 115 and node intb 123.

SUMMARY OF THE INVENTION

Accordingly, what is needed is a level shifter circuit that is insensitive to noise on the input terminals and also that does not have leakage currents due to noise induced crowbar currents.

A circuit is disclosed that latches at least one of a plurality of input terminals of a level shifter to at least one of a plurality of supply voltages that are associated with respective supply voltage domains when the at least one of the plurality of supply voltages is powered down. The circuit is insensitive to noise at the input terminals. The circuit does not have leakage currents associated with noise induced crowbar currents.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
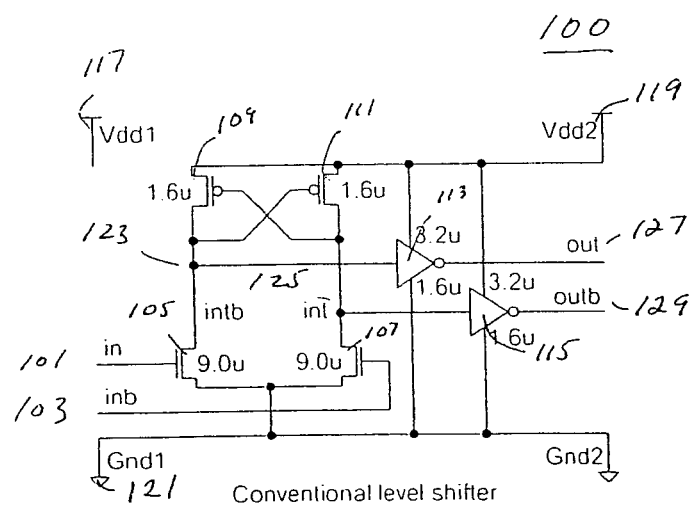
FIG. 1 shows a conventional level shifter circuit.
Figure 2:
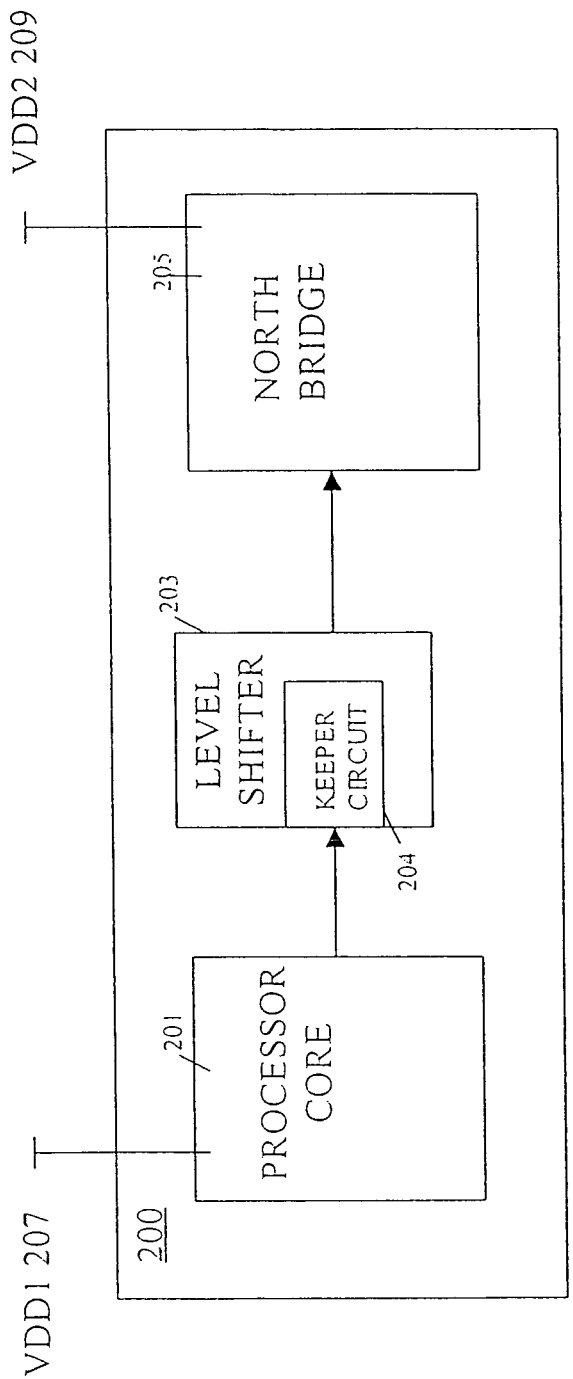
FIG. 2 shows a microprocessor die that includes a level shifter that is located between processor core and north-bridge inhabitants of the microprocessor die according to one embodiment of the present invention.

Level Shifter for Noise and Leakage Suppression According to One Embodiment of the Present Invention FIG. 2 shows an integrated circuit, e.g., a microprocessor die 200, that includes a level shifter circuit 203 that is located between processor core and north-bridge inhabitants of the microprocessor die 200 according to one embodiment of the present invention. Level shifter circuit 203 operates between different voltage domains of circuits 201 and 205. In one embodiment, level shifter 203 includes a circuit that couples one of the input terminals of the level shifter 203 to one of a plurality of supply voltages that are associated with respective supply voltage domains that are coupled together by the level shifter 203 when one the plurality of supply voltages is powered down (e.g., zero volts). In one example, the input terminals of level shifter 203 are gated by the power supply signal of processor core 201. The stable reference provided by the powered down power supply, blocks undesirable current flow or leakage when noise couples onto the input terminals and causes NFETs to turn "on". Also, the power supply signal has a large amount of power supply capacitance that makes it immune to coupling noise and helps provide a stable "zero" when powered down. More specifically, FIG. 2 shows processor core 201, level shifter 203, keeper circuit 204, north-bridge 205, power supply domain Vdd1 207, power supply domain Vdd2 209, input voltages and output voltages.

Processor core 201 includes the main logic circuits of microprocessor die 200. In the FIG. 2 embodiment, north bridge 205 is a part of the microprocessor die 200 and can connect to a microprocessor on a system input/output (I/O) or front-side bus (not shown). The north bridge can have interfaces that connect to main memory (RAM), an accelerated graphics port (AGP) graphics channel, a peripheral component interface (PCI) bus, and/or a south-bridge component of a system chipset for instance.

In one embodiment, processor core 201 and north-bridge 205 components of microprocessor die 200 operate in different voltage domains. In the FIG. 2 embodiment, processor core 201 and north-bridge 205 are shown as being powered by power supply voltage domains that correspond to supply voltage Vdd1 207 and supply voltage Vdd2 209 respectively. Consequently, signals that move between these two components of microprocessor die 200 need to be level shifted. Level shifter 203 shifts the level of the signals that move between these two components from supply voltage Vdd1 207 to supply voltage Vdd2 209. It should be appreciated that level shifter 203 can operate between any voltage domains, and its operation as a part of integrated circuit 200 is merely one example.

More specifically, level shifter 203 receives signals in a first power supply domain (e.g., corresponding to Vdd1 207) and outputs signals in a second power supply domain (e.g., corresponding to Vdd2 209). In one embodiment, when supply voltage Vdd1 is powered, level shifter 203 uses supply voltage Vdd1 207 as an input, e.g., as an enable signal that enables the operation of level shifter 203 (see FIG. 4 implementation below). Alternately, when supply voltage Vdd1 207 is not powered (such as when power is interrupted or discontinued for power savings purposes, etc.), noise and leakage suppression and keeper circuit 204 components of level shifter 203 act to couple an input of the level shifter 203 to supply voltage Vdd1 207 (then zero volts), and to maintain the logic levels that exist at the time that supply voltage Vdd1 is powered down. The input terminals to level shifter 203 are gated when Vdd 207 becomes zero thereby preventing noise on the input from reaching circuitry within the level shifter. Also, the power supply signal Vdd1 207 has a large amount of power supply capacitance that makes it immune to coupling noise and helps provide a stable "zero" when powered down thus enhancing the gating operation.

In one embodiment, because noise caused current conduction (causing undesirable current leakage) is avoided, the level shifter 203 can reliably maintain the logic states that are last supplied by level shifter inputs before supply voltage Vdd1 207 is powered down.

Advantages of exemplary embodiments include high noise resistance when the supply voltage (e.g., Vdd1 207) is powered down. This high noise resistance is at least partially attributable to a stacked arrangement (see FIG. 4 discussion) of components that are used to couple level shifter inputs to a stable ground reference, which results in the elimination of noise induced leakage current as discussed above.

Figure 3:
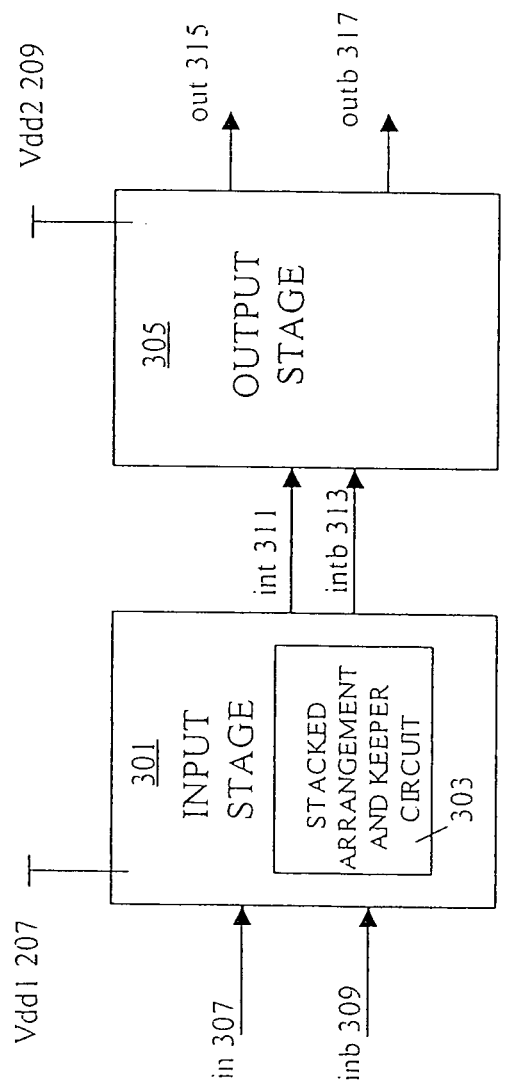
FIG. 3 is a block diagram that shows the stages of a level shifter circuit according to one embodiment of the present invention.

FIG. 3 is a block diagram that shows the stages of a level shifter circuit (e.g., 203 in FIG. 2) according to one embodiment of the present invention. In the FIG. 3 embodiment, block diagram shows level shifter input stage 301, noise and leakage suppression and keeper circuit 303, level shifter output stage 305, supply voltage Vdd1 207 and supply voltage Vdd2 209 and inputs in 307, inb 309, int 311 and intb 313 and outputs out 315 and outb 317.

Level shifter input stage 301 receives inputs to level shifter circuit 203. In one embodiment, level shifter input stage 301 components are powered using supply voltage Vdd2 209. In exemplary embodiments, level shifter input stage 301 includes noise and leakage suppression components and keeper circuit 303. In one embodiment, when supply voltage Vdd1 207 is powered down, a stacked arrangement of noise and leakage suppression components of the noise and leakage suppression and keeper circuit 303 block the unintended and undesirable conduction of current in input stage 301 components as discussed herein. Therefore, when Vdd1 207 is powered down, the inputs 307 and 309 are effectively gated.

Moreover, when Vdd1 207 is not powered (such as when power is interrupted or discontinued for power savings purposes etc.), a "keeper" component of leakage suppression and keeper circuit 303 acts to maintain logic levels that last existed at the time at which supply voltage Vdd1 207 was powered up. Level shifter output stage 305 processes the inputs received by the level shifter input stage 301 and supplies a level shifted output signal that is accessible by external circuits.

In operation, input stage 301 receives two inputs in 307 and inb 309 of a first voltage domain. In one embodiment, inputs in 307 and inb 309 are logical inputs. Input stage 301 generates two outputs int 311 and intb 313. These outputs, int 311 and intb 313, are supplied as inputs to output stage 305. Output stage 305 generates two outputs, out 315 and outb 317 of a second voltage domain. These outputs can be supplied to external circuitry. In one embodiment, int 311, intb 313, out 315 and outb 317 are logical signals as well.

It should be appreciated that inputs in 307 and inb 309 represent complementary, full-swing signals in a first voltage domain that corresponds to supply voltage Vdd1 207 that are converted into complementary, full-swing signals, out 315 and outb 317, in a second voltage domain that corresponds to supply voltage Vdd2 209. In one embodiment, the respective voltage domains that correspond to supply voltages Vdd1 207 and Vdd2 209 share a common ground (see discussion below).

Figure 4:
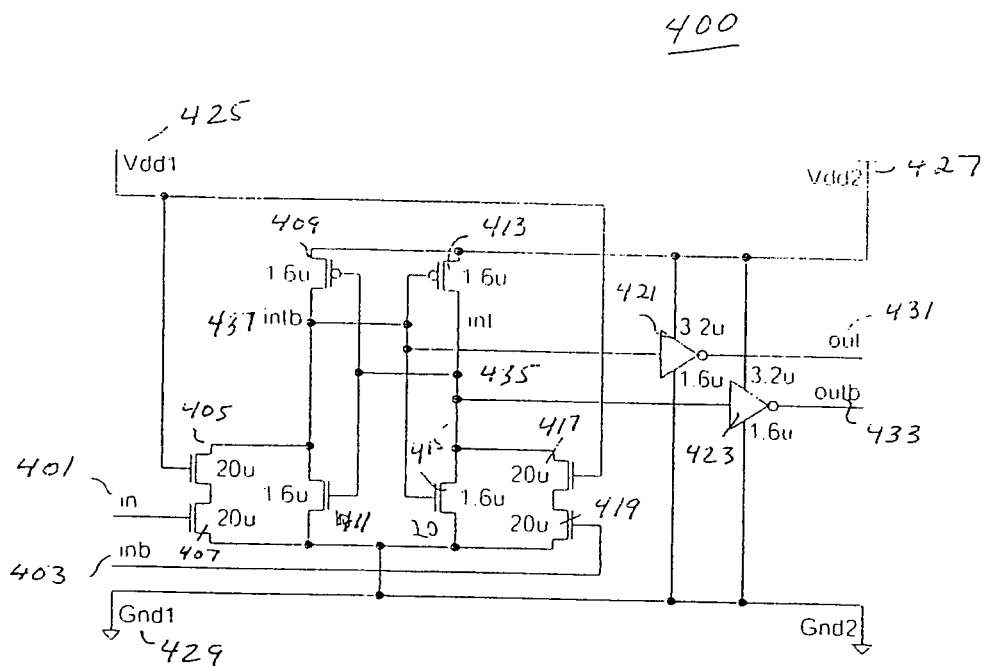
FIG. 4 shows a circuit implementation of a level shifter circuit according to one embodiment of the present invention.

FIG. 4 shows a circuit implementation of a level shifter 400 according to one embodiment of the present invention. In the FIG. 4 embodiment, level shifter 400 includes input terminal (in) 401, input terminal (inb) 403, transistors 405-419 (NFETs and PFETs), inverter 421, inverter 423, supply voltage Vdd1 425, supply voltage Vdd2 427 and ground 429.

Inputs to level shifter 400 are made at input terminals (in) 401 and (inb) 403 of the first voltage domain. Inputs received at these terminals are signals supplied from the power supply voltage domain that corresponds to supply voltage Vdd1 425. In one embodiment, stacked arrangements of transistors 405 and 411 and 415 and 417 are coupled to transistors 407 and 419 respectively. In one embodiment, when supply voltage Vdd1 425 is powered down, the stacked arrangements of transistors 405 and 407 and 417 and 419 serve as noise and leakage suppression components by gating the inputs 401 and 403. In addition, the "keeper" transistors 411 and 415 along with cross-coupled PFETs 409 and 413 facilitate the maintenance of circuit logic states that existed at the point in time at which supply voltage Vdd1 was powered down. In this configuration, supply voltage Vdd1 425 acts as an input enable signal, that is immune to coupling noise (on account of the large power supply capacitance on Vdd1 425).

Transistors 409 and 411 and 413 and 415 are configured as cross-coupled inverters. These cross-coupled inverters hold whatever state that is applied by in 401 and inb 403 when supply voltage Vdd1 is powered down. In one embodiment, the capacity to maintain states is facilitated by transistors 411 and 415 which act as "keeper" transistors that prevent circuit devices from switching states. Inverter 421 and inverter 423 output level shifted output voltages to output terminal (out) 431 and output terminal (outb) 433 respectively.

In operation, when both supply voltage Vdd1 425 and supply voltage Vdd2 427 are supplying power to level shifter 400, supply voltage Vdd1 425 operates to turn "on" the two input NFETs, 405 and 417, by exceeding Vtn relative to gnd 429. If in 401 goes high during this time; then intb 437 will fall and drive out 431 "high". When intb 437 falls, cross-coupled PFET 413 is turned "on" and will drive int 435 "high". When int 435 rises then outb 433 is driven "low". The inputs are therefore enabled when supply voltage Vdd1 425 is powered "on".

Alternately, when supply voltage Vdd1 425 is supplying power to circuit input drivers and supply voltage Vdd2 427 is supplying power to level shifter 400 and supply voltage Vdd1 425 is powered down, the voltage supplied by supply voltage Vdd1 425 falls to zero volts due to leakage through its load. When Vdd1 425 falls to zero volts, the circuit input drivers assume a high impedance state and both input terminals 401 and 403 are weakly driven to zero by leakage currents from the input power supply Vdd1 425 and Gnd1 429. This makes the input terminals 401 and 403 highly susceptible to coupled noise injection. It should be appreciated that noise coupled onto the input terminals in 401 or inb 403 have the potential of turning "on" the input NFETs by exceeding Vtn relative to ground.

However, the falling of the voltage level of supply voltage Vdd1 425 to zero volts turns off the two NFETs 405 and 417 and thus inputs 401 and 403 are thereby effectively gated. More specifically, when input supply voltage Vdd1 425 is powered down, the two NFETs 405 and 417 turn "off" and block undesirable current flow or leakage when noise couples onto the input terminals and causes the input NFETs 407 and 419 to turn "on". In one embodiment, the cross-coupled inverters of the input stage hold the state that was applied by in 401 and inb 403 at the point in time at which supply voltage Vdd1 425 was powered down.

Exemplary Operations in Accordance with Embodiments of the Present Invention

Figure 5:
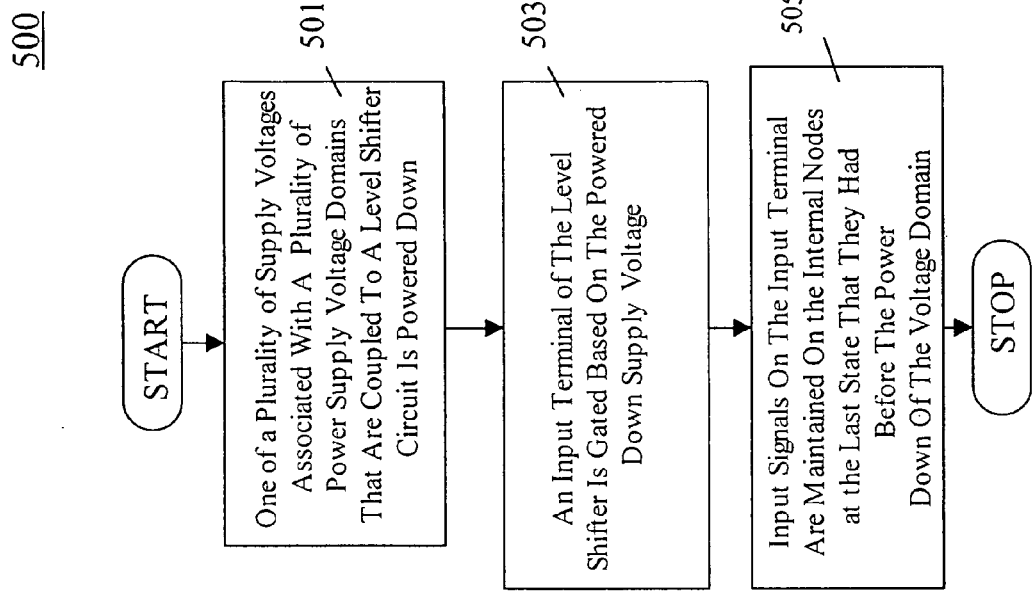
FIG. 5 is a flowchart of steps performed in a method for noise and leakage suppression in accordance with one embodiment of the present invention.

FIG. 5 is a flowchart 500 of steps performed in a process of noise and leakage suppression using the level shifter circuit in accordance with one embodiment of the present invention. Although specific steps are disclosed in the flowchart, such steps are exemplary. That is, the present invention is well suited to performing various other steps or variations of the steps recited in FIG. 5.

At step 501, one of a plurality of supply voltages associated with a plurality of power supply voltage domains that are coupled to a level shifter circuit is powered down. In one embodiment, the supply voltage can be switched off as a power savings measure.

At step 503, an input terminal of the level shifter is gated to the powered down supply voltage and input voltages are held. In one embodiment, when the supply voltage (e.g., Vdd1 207 in FIGS. 2 and 3) is powered down, a stacked arrangement of noise and leakage suppression components of a leakage suppression and keeper circuit (e.g., 303 in FIG. 3) gate the unintended and undesirable conduction of current in input stage (e.g., 301 in FIG. 3) components as discussed herein.

In addition, when the supply voltage is powered down (such as when power is interrupted or discontinued for power savings purposes etc.), a "keeper" component of a leakage suppression and keeper circuit (e.g., 303 in FIG. 3) acts, at step 505 to maintain level shifter logic levels that existed at the time at which the supply voltage is powered down.

A circuit is disclosed that latches at least one of a plurality of input terminals of a level shifter to at least one of a plurality of supply voltages that are associated with respective supply voltage domains when the at least one of the plurality of supply voltages is powered down.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A level shifter circuit comprising:
an input stage comprising input terminals configured to couple with a first voltage domain; and
an output stage configured to produce complementary output signals for a second voltage domain that are based on complementary input signals,
wherein the input stage comprises circuitry configured to gate input signals of the input terminals in response to a powering down of the first voltage domain and a pair of cross coupled inverters configured to maintain the last state of the input signals responsive to the powering down of the first voltage domain, wherein the pair of cross coupled inverters comprise transistors that are coupled to ground.

2. A level shifter circuit as described in claim 1 wherein the circuitry configured to gate comprises a stacked arrangement of circuit elements.

3. A level shifter circuit as described in claim 2 wherein the stacked arrangement of circuit elements prevents leakage current of the level shifter circuit from the second voltage domain.

4. A level shifter circuit as described in claim 1 wherein the output stage produces full-swing complementary output signals of the second voltage domain in response to full-swing complementary input signals of the first voltage domain received at the input stage.

5. A level shifter circuit as described in claim 1 wherein the first and second voltage domains share a common ground.

6. A circuit comprising:
an input stage configured to couple to a first voltage domain; and
an output stage coupled to the input stage and configured to produce complementary output signals for a second voltage domain that are based on complementary input signals and configured to couple to a second voltage domain,
wherein an input terminal of the input stage is configured to be gated in response to a powering down of the first voltage domain and a pair of cross coupled inverters in the input stage hold the last state that is applied to input terminals of the input stage when the first voltage domain is powered down, wherein the pair of cross coupled inverters comprise transistors that are coupled to ground.

7. The circuit of claim 6, wherein the input stage comprises a stacked arrangement of circuit elements coupled to the input terminals and coupled to the first voltage domain wherein the stacked arrangement is operable to block current conduction in components of the input stage.

8. The circuit of claim 6, wherein complementary, full-swing signals in the first power supply voltage domain at the input stage are converted into complementary, full-swing signals in the second power supply voltage domain at the output stage.

9. The circuit of claim 6, wherein a stacked configuration of circuit elements of the input stage prevents leakage from the second voltage domain.

10. The circuit of claim 6, wherein the first and second plurality of power supply voltage domains share a common ground.

11. A processor circuit comprising:
 a processor core;
 a north-bridge circuit; and
 a level shifting circuit coupled between the processor core and the north bridge circuit, the level shifting circuit comprising:
  an input stage; and
  an output stage coupled to the input stage and configured to produce complementary output signals for a second voltage domain that are based on complementary input signals,
 wherein an input terminal of the input stage is configured to be gated in response to a powering down of the first voltage domain and a pair of cross coupled inverters in the input stage hold the last state that is applied to input terminals of the input stage responsive to the powering down of the first voltage domain, and wherein the pair of cross coupled inverters comprise transistors that are coupled to ground.

12. The processor circuit of claim 11, wherein the input stage comprises a stacked arrangement of circuit elements coupled to the input terminals and coupled to the first voltage domain and wherein the stacked arrangement blocks current conduction in components of the input stage.

13. The processor circuit of claim 11, wherein complementary, full-swing signals in the first voltage domain are converted to complementary, full-swing signals in a second voltage domain associated with the north bridge circuit.

14. The processor circuit of claim 11, wherein the input stage comprises a stacked configuration of circuit elements operable to gate the input terminal.

15. The processor circuit of claim 14, wherein the stacked configuration of circuit elements prevents leakage from a second voltage domain associated with the north-bridge circuit.

16. A level shifter circuit comprising:
 means for receiving complementary input signals coupled to a first voltage domain; and
 means for outputting complementary output signals for a second voltage domain that are based on the complementary input signals,
 wherein the means for receiving complementary input signals comprises means for gating the complementary input signals in direct response to a powering down of the first voltage domain and further comprises a pair of cross coupled inverters for maintaining the last state of the complementary input signals when the first voltage domain is powered down, wherein the pair of cross coupled inverters comprise transistors that are coupled to ground.

17. A level shifter circuit as described in claim 16 wherein the pair of cross coupled inverters comprises a first set of transistors and a second set of transistors.

18. A level shifter circuit as described in claim 16 wherein the means for outputting complementary output signals produces full-swing complementary output signals of the second voltage domain in response to full-swing complementary input signals of the first voltage domain received at the means for receiving complementary input signals.

19. A level shifter circuit comprising:
 input circuitry comprising input terminals configured to couple with a first voltage domain; and
 output circuitry configured to produce complementary output signals for a second voltage domain that are based on complementary input signals,
 wherein the input circuitry comprises circuitry configured to gate input signals in response to a powering down of the first voltage domain and a pair of cross coupled inverters configured to maintain the last state of the input signals when the first voltage domain is powered down, wherein the pair of cross coupled inverters comprise transistors that are coupled to ground.

20. A level shifter circuit as described in claim 19 wherein the output circuitry produces full-swing complementary output signals of the second voltage domain in response to full-swing complementary input signals of the first voltage domain received at the input circuitry.

* * * * *